United States Patent
Anguiano-Wehde et al.

(10) Patent No.: US 8,995,124 B2
(45) Date of Patent: *Mar. 31, 2015

(54) COVER LATCH OF A BLADE SERVER

(75) Inventors: Nadia Anguiano-Wehde, Rochester, MN (US); Aaron M. Hegrenes, Rochester, MN (US); Nathan D. Karl, Rochester, MN (US); Seth D. Lewis, Rochester, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 268 days.

This patent is subject to a terminal disclaimer.

(21) Appl. No.: 13/557,826

(22) Filed: Jul. 25, 2012

(65) Prior Publication Data

US 2012/0287573 A1   Nov. 15, 2012

Related U.S. Application Data

(63) Continuation of application No. 12/892,164, filed on Sep. 28, 2010, now Pat. No. 8,315,049.

(51) Int. Cl.
*G06F 1/16*   (2006.01)
*E05C 3/14*   (2006.01)
*G06F 1/18*   (2006.01)
(Continued)

(52) U.S. Cl.
CPC . *E05C 3/14* (2013.01); *G06F 1/181* (2013.01); *H05K 7/1487* (2013.01); *E05B 65/006* (2013.01)
USPC ................... 361/679.55; 312/265.5; 206/320; 439/541

(58) Field of Classification Search
USPC ........ 312/223.1, 223.6, 194, 322, 223.2, 209, 312/249.7, 236, 319.5, 265.5, 351.1, 326; 361/679.58, 752, 798, 679.31, 679.47, 361/679.4, 679.03, 679.26, 679.29, 679.3, 361/679.02, 679.28, 679.45, 679.27, 361/679.43, 679.33; 206/308.1, 320, 307, 206/315.11, 581, 366, 315.3, 315.5; 439/345, 304, 92, 79, 487, 626, 108, 439/607.2, 629, 607.1, 638, 607.55, 541.5, 439/532; 248/314, 422.2, 224.4, 205.3, 248/918, 278.1; 220/1.5, 630, 23.87
See application file for complete search history.

(56) References Cited

U.S. PATENT DOCUMENTS 4,821,145 A   4/1989 Corfits et al.
6,252,514 B1   6/2001 Nolan et al.
(Continued)

OTHER PUBLICATIONS

Notice of Allowance, U.S. Appl. No. 12/892,164, Jul. 10, 2012.

*Primary Examiner* — Hung Duong
(74) *Attorney, Agent, or Firm* — Edward J. Lenart; Katherine S. Brown; Kennedy Lenart Spraggins LLP

(57) ABSTRACT

A cover latch is provided for coupling a blade server cover to a blade server when the cover latch is in a locked state. Embodiments include a locking surface and a user interface; wherein when the cover latch is in the locked state, the locking surface engages a locking surface enclosure of the blade server cover; wherein when the cover latch is in an unlocked state, the user interface is rotated into the blade server and the locking surface is rotated outward from the blade server, wherein when the locking surface is rotated outward from the blade server, the locking surface is disengaged from the locking surface enclosure of the blade server cover; and a rotational limiter hole in the cover latch that surrounds a peg of the blade server, wherein the rotation of the locking surface and the user interface is limited by the rotational limiter.

20 Claims, 5 Drawing Sheets

(51) Int. Cl.
*H05K 7/14* (2006.01)
*E05B 65/00* (2006.01)

(56) References Cited

U.S. PATENT DOCUMENTS

| | | |
|---|---|---|
| 7,466,561 B2 | 12/2008 | Dean |
| 7,679,933 B2 | 3/2010 | Makabe |
| 7,684,208 B2 * | 3/2010 | Okamoto et al. ............. 361/798 |
| 8,315,049 B2 * | 11/2012 | Anguiano-Wehde et al. ........................ 361/679.55 |
| 2011/0215012 A1 * | 9/2011 | Haggard ................... 206/308.1 |
| 2012/0034803 A1 | 2/2012 | Sasaki et al. |
| 2012/0075800 A1 | 3/2012 | Anguiano-Wehde et al. |
| 2012/0145451 A1 | 6/2012 | Dahl et al. |

* cited by examiner

COVER LATCH OF A BLADE SERVER

CROSS-REFERENCE TO RELATED APPLICATION

This application is a continuation application of and claims priority from U.S. patent application Ser. No. 12/892,164, filed on Sep. 28, 2010.

BACKGROUND OF THE INVENTION

1. Field of the Invention

The field of the invention is data processing, or, more specifically, apparatuses that include a cover latch of a blade server.

2. Description of Related Art

A blade sever cover may be attached to a blade server to protect the components of the blade server. A cover latch may be used to couple the blade server cover to the blade server. Conventional cover latches typically require the securing mechanism of the cover latch to move into the blade server thereby preventing the placement of blade server components in that area. Restricting component placement within the blade server limits the resources of the blade server. There is therefore an ongoing need for a new cover latch for a blade server.

SUMMARY OF THE INVENTION

A cover latch is provided for coupling a blade server cover to a blade server when the cover latch is in a locked state. Embodiments include a locking surface at one end of the cover latch; a user interface at an end of the cover latch opposite from the end with the locking surface; wherein when the cover latch is in the locked state, the locking surface engages a locking surface enclosure of the blade server cover; wherein when the cover latch is in an unlocked state, the user interface is rotated into the blade server and the locking surface is rotated outward from the blade server, wherein when the locking surface is rotated outward from the blade server, the locking surface is disengaged from the locking surface enclosure of the blade server cover; and a rotational limiter hole in the cover latch that surrounds a peg of the blade server, wherein the rotation of the locking surface and the user interface is limited by the rotational limiter.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
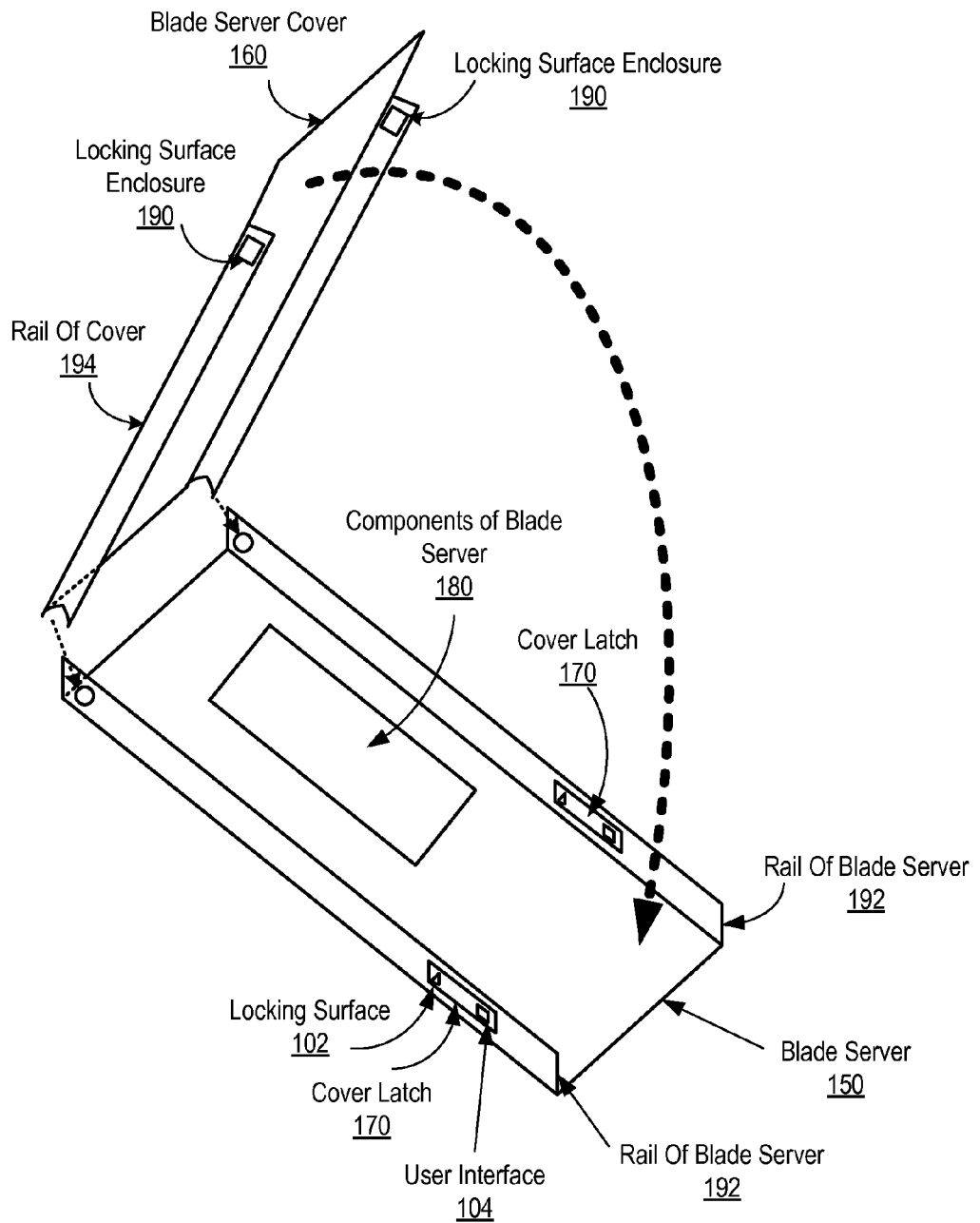
FIG. 1 sets forth a diagram of an apparatus that includes a cover latch for coupling a blade server cover to a blade server according to embodiments of the present invention.

An exemplary apparatus that includes a cover latch for coupling a blade server cover to a blade server in accordance with the present invention is described with reference to the accompanying drawings, beginning with FIG. 1. FIG. 1 sets forth a diagram of an apparatus that includes a cover latch (170) for coupling a blade server cover (160) to a blade server (150) according to embodiments of the present invention.

The blade server (150) of FIG. 1 is a stripped down computer server with a modular design optimized to minimize the use of physical space. Typical blade servers have many components of a computer removed to save space, minimize power consumption, and other considerations, while still having all the functional components (180) to be considered a computer. The blade server (150) of FIG. 1 may be stored in a bay of a blade chassis, which provides services, such as power, cooling, networking, various interconnects and management to each blade server in a bay. A blade server chassis may be a 12.25-inch box that, from the front, contains as many as 14 slide-in blade servers. Blade servers use shared components in the blade server chassis, such as power supplies and remote management consoles, reducing the components necessary in each individual blade server.

The blade server cover (160) of FIG. 1 may be coupled to the blade server (150) to protect the components (180) of the blade server (150). Rails (194) of the blade server cover (160) are coupled to the rails (192) of the blade server (150) by the cover latch (170).

The cover latch (170) of FIG. 1 includes a locking surface (102) at one end of the cover latch (170). The locking surface (102) is shaped as a half cylindrical cone. However, the locking surface (102) according to the present invention may be any shape that enables the locking surface (102) to engage a corresponding locking surface enclosure (190) of the blade server cover (160). When the cover latch (170) is in a locked state, the locking surface (102) engages the locking surface enclosure (190) of the blade server cover (160).

The cover latch (170) of FIG. 1 includes a user interface (104) at an end that is opposite to the end of the cover latch (170) that includes the locking surface (102). The user interface (104) of FIG. 1 is shaped as a square surface, however, the user interface (104) according to the present invention may be any shape that enables a user to push the user interface (104). The user interface (104) of FIG. 1 is coupled to the locking surface (102) such that rotating the user interface (104) into the blade server (150) causes the locking surface (102) to rotate outward from the blade server (150). To rotate the user interface (104) into the blade server, the user interface (104) is depressed by a user. When the locking surface (102) is rotated outward from the blade server (150), the locking surface (102) disengages from the locking surface enclosure (190) of the blade server cover (160), enabling the blade server cover (160) to be removed from the blade server (150).

Figure 2:
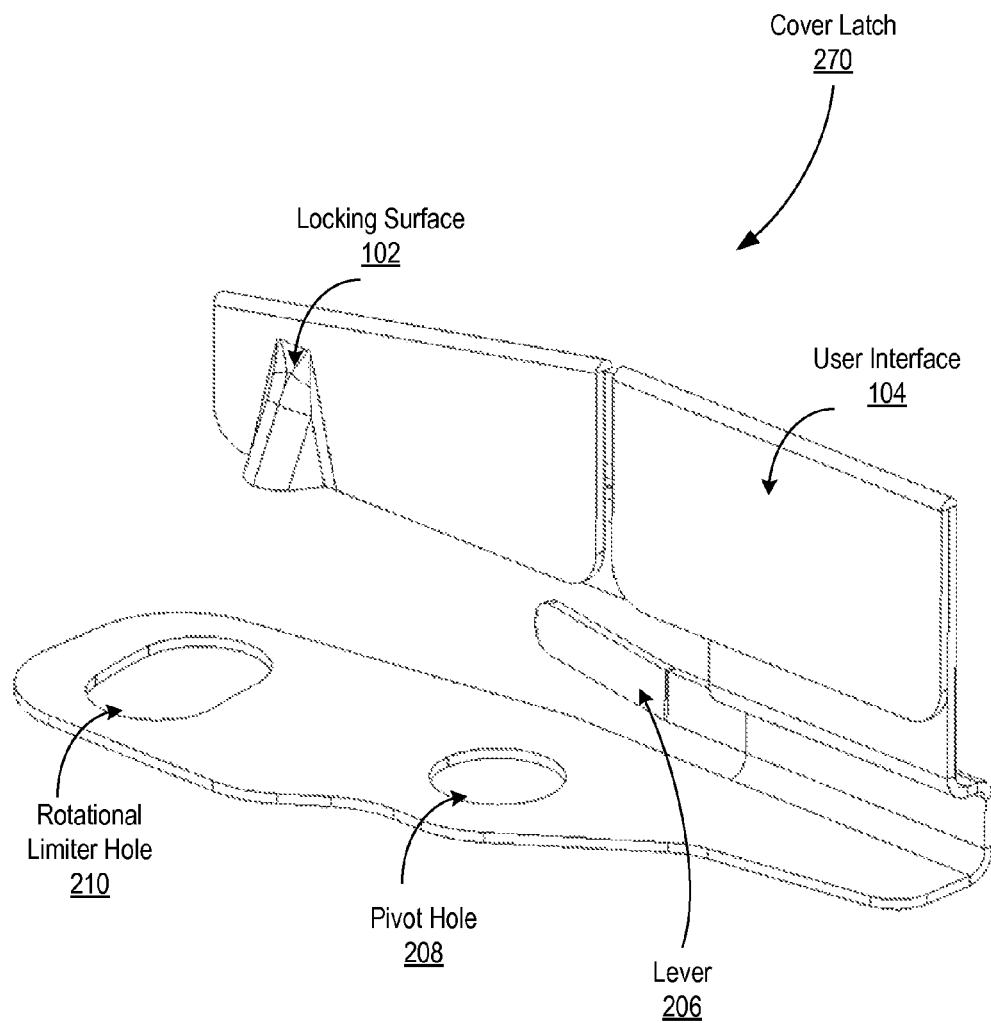
FIG. 2 sets forth an exemplary embodiment of a cover latch for coupling a blade server cover to a blade server according to embodiments of the present invention.

FIG. 2 sets forth an exemplary embodiment of a cover latch (270) for coupling a blade server cover (160) to a blade server (150) according to embodiments of the present invention. The cover latch (270) includes the locking surface (102) and the user interface (102) of the cover latch (170) of FIG. 1. The cover latch (270) of FIG. 2 also includes a rotational limiter hole (210), a pivot hole (208), and a lever (206) that are not illustrated as components of the cover latch (170) of FIG. 1.

The example cover latch (270) of FIG. 2 is one piece. That is, the locking surface (102), the user interface (104), the rotational limiter hole (210), the pivot hole (208), and the lever (206) are integrated into a single piece of the cover latch (270).

The rotational limiter hole (210) of FIG. 2 is shaped to surround a peg of the blade server (150). The shape of the rotational limiter hole (210) limits the movement of the cover latch (170) relative to an attached blade server. The movement of the peg of the blade server within the rotational limiter hole (210) corresponds to the limit of rotation of the locking surface (102) and the user interface (104). Thus, the interaction between the rotational limiter hole (210) and the peg of the blade server controls the degree of rotation of the locking surface (102) and the user interface (104). The rotational limiter hole (210) limits the rotation of the locking surface (102) and the user interface (104) based on a size of area between the rotational limiter hole (210) and a peg of a blade server. For example, one end of the rotational limiter hole (210) controls how far the locking surface (102) rotates outward from the locking surface enclosure of the blade server cover relative to the peg and the other end of the rotational limiter hole (210) limits how far the locking surface (102) rotates inward towards the locking surface enclosure of the blade server cover relative to the peg. The size of the rotational limiter hole (210) may be selected to enable the minimal amount of rotation of the locking surface (102) that is required to release the locking surface (102) from a locking surface enclosure of a blade server cover. By limiting the amount of rotation of the locking surface (102) and the user interface (104), the amount of intrusion into the blade server is reduced, enabling more room for components within the blade server.

The pivot hole (208) of FIG. 2 attaches the cover latch (270) to a blade server. The pivot hole (208) is a hole for surrounding a peg of the blade server. In addition to coupling the cover latch (270) to a blade server, the pivot hole (208) acts as a pivot upon which the locking surface (102) and the user interface (104) rotate.

The lever (206) of the cover latch (270) may be spring biased away from a blade server to keep the cover latch (270) in the locked state. For example, absent a user pressing on the user interface (104), the lever (208) applies a force to the rail of the blade server that keeps the user interface (104) rotated outward away from the blade server and keeps the locking surface (102) rotated inward to engage the locking surface enclosure of a blade server cover.

Figure 3A:
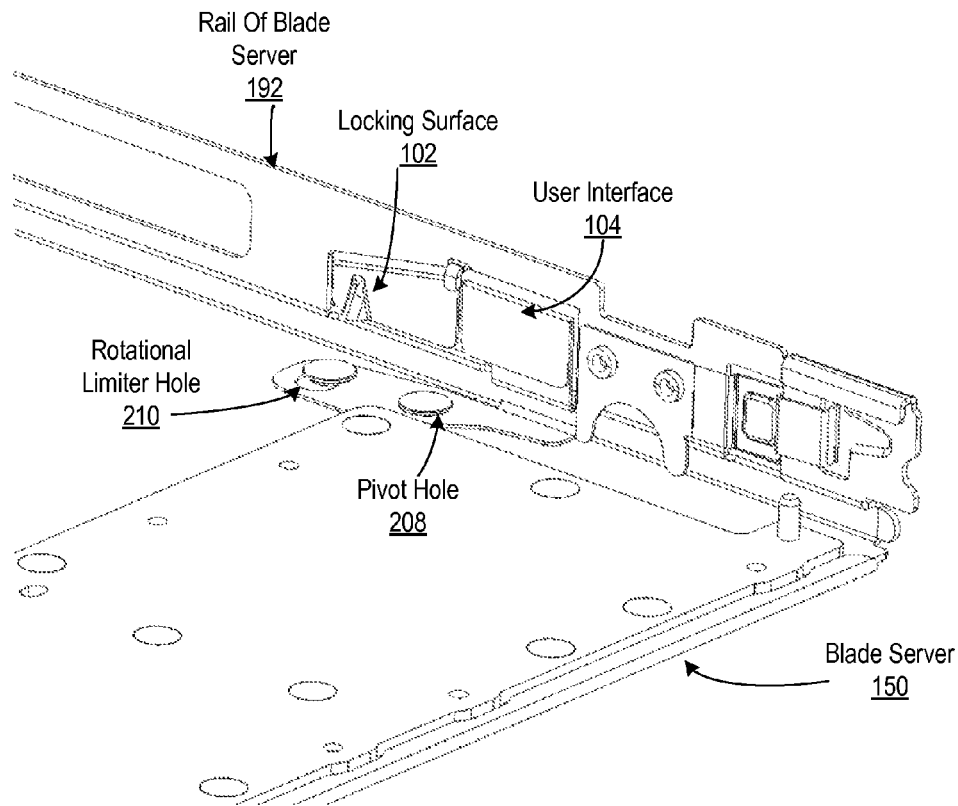
FIG. 3A sets forth an exemplary apparatus that includes a cover latch for coupling a blade server cover to a blade server according to embodiments of the present invention.

FIG. 3A sets forth an exemplary apparatus that includes a cover latch for coupling a blade server cover to a blade server (150) according to embodiments of the present invention. The cover latch of FIG. 3A is in a locked state. In the locked state, the locking surface (102) is rotated into the blade server (150) and the user interface (104) is rotated outwards from the blade server (150) such that the locking surface (102) is in a position to engage a locking surface enclosure of a blade server cover. For example, if a blade server cover is in position over the blade server (150) when the cover latch is in a locked state, a locking surface enclosure would enclose the locking surface (102), preventing the blade server cover from decoupling from the blade server (150).

Figure 3B:
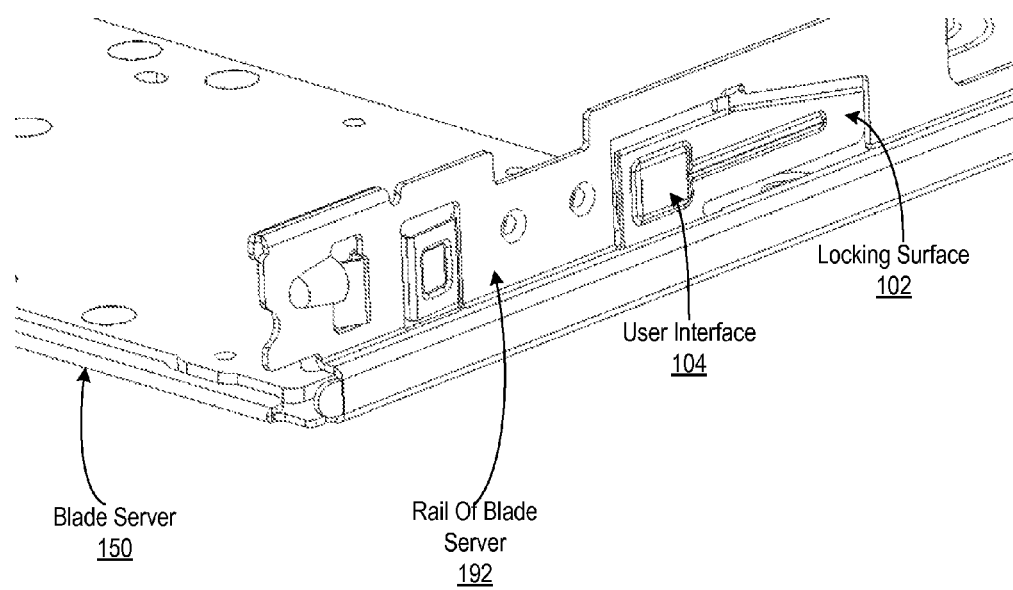
FIG. 3B sets forth an alternative view of the apparatus of FIG. 3A that includes a cover latch for coupling a blade server cover to a blade server according to embodiments of the present invention FIG. 4 sets forth an exemplary apparatus that includes a cover latch for coupling a blade server cover to a blade server according to embodiments of the present invention.

FIG. 3B sets forth an alternative view of the apparatus of FIG. 3A that includes a cover latch for coupling a blade server cover to a blade server (150) according to embodiments of the present invention. That is, the apparatus of FIG. 3B is similar to the apparatus of FIG. 3A in that it includes a cover latch in a locked state with the locking surface (102) and the user interface (104) integrated within the rail (192) of a blade server (150). The alternative view illustrated in FIG. 3B shows the area of the user interface (104) that a user depresses to unlock the cover latch. The user interface (104) of FIG. 3B may include a raised surface for the user to press. In the locked state, the user interface (104) and the locking surface (102) are substantially parallel with the rail (192) of the blade server (150).

Figure 4:
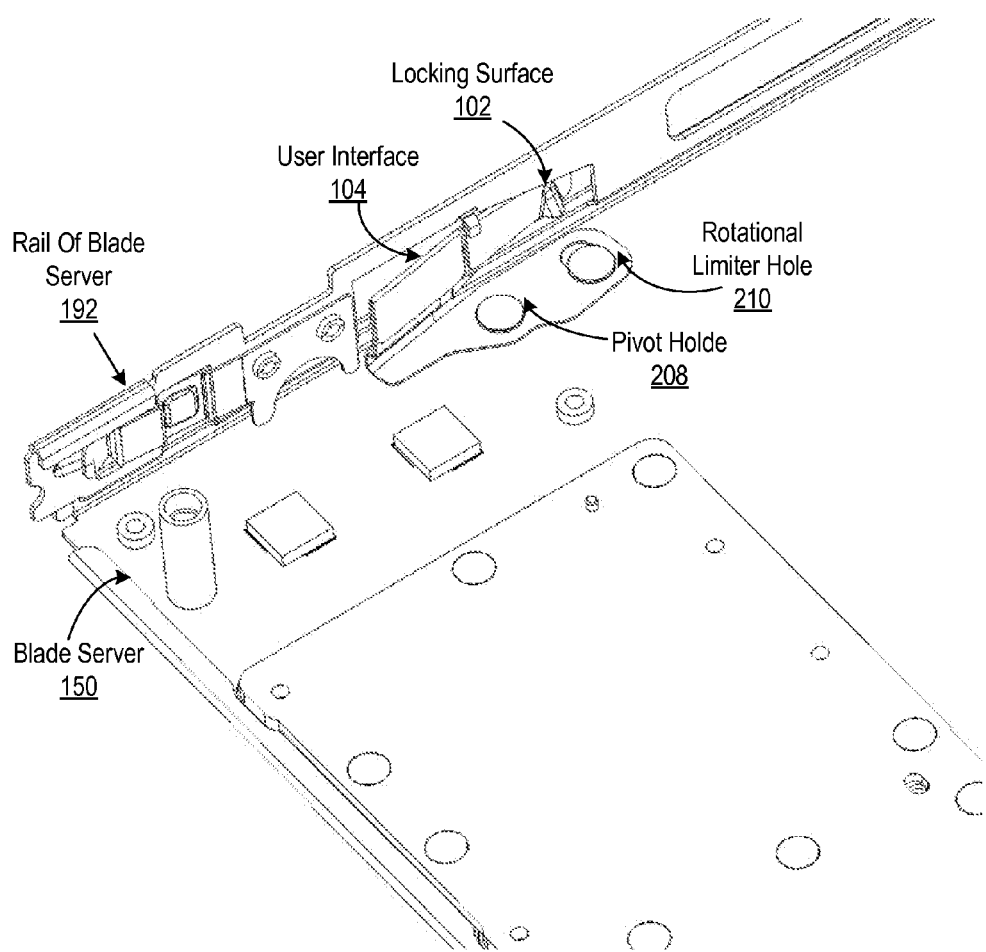

FIG. 4 sets forth an exemplary apparatus that includes a cover latch for coupling a blade server cover to a blade server (150) according to embodiments of the present invention. The cover latch of FIG. 4 is in an unlocked state. In the unlocked state, the locking surface (102) is rotated outwards away from the blade server (150) and the user interface (104) is rotated into the blade server (150) such that the locking surface (102) is not in a position to engage a locking surface enclosure of a blade server cover. For example, if a blade server cover is in position over the blade server (150) when the cover latch is in an unlocked state, the locking surface (102) would not be enclosed by a locking surface enclosure and thus the blade server cover would be free to decouple from the blade server (150). The cover latch may be transitioned from a locked state to an unlocked state by a user pressing the user interface (104). The cover latch may be returned to the locked state by the user releasing pressure from the user interface (104).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A cover latch for coupling a blade server cover to a blade server when the cover latch is in a locked state, the cover latch comprising:
   a locking surface at one end of the cover latch;
   a user interface at an end of the cover latch opposite from the end with the locking surface;
   wherein the locking surface and the user interface rotate relative to the blade server based on engagement of the locking surface with a locking surface enclosure of the blade server cover;
   a rotational limiter hole in the cover latch that surrounds a peg of the blade server, wherein the rotation of the locking surface and the user interface is limited by the rotational limiter.

2. The cover latch of claim 1, wherein the cover latch is one piece.

3. The cover latch of claim 1, wherein the rotational limiter hole limits the rotation of the locking surface and the user interface based on a size of area between the rotational limiter hole and the peg.

4. The cover latch of claim 1, further comprising a lever that is spring biased away from a rail of the blade server to keep the cover latch in a locked state.

5. The cover latch of claim 1, wherein the user interface includes a button for a user to push.

6. The cover latch of claim 1, further comprising a pivot hole that attaches the cover latch to the blade server and acts as a pivot upon which the locking surface and the user interface rotate.

7. The cover latch of claim 1, wherein the cover latch is integrated into a rail of a blade server.

8. The cover latch of claim 7, wherein in a locked state, the user interface and the locking surface are substantially parallel with the rail of the blade server.

9. The cover latch of claim 7, wherein in a unlocked state, the locking surface extends outward from the rail of the blade server and the user interface extends in an opposite rotational direction from the locking surface, wherein the opposite rotational direction is inward into the blade server.

10. A blade server assembly comprising:
a blade server;
a blade server cover; and
a cover latch for coupling the blade server cover to the blade server when the cover latch is in a locked state, the cover latch comprising:
a locking surface at one end of the cover latch;
a user interface at an end of the cover latch opposite from the end with the locking surface;
wherein the locking surface and the user interface rotate relative to the blade server based on engagement of the locking surface with a locking surface enclosure of the blade server cover;
a rotational limiter hole in the cover latch that surrounds a peg of the blade server, wherein the rotation of the locking surface and the user interface is limited by the rotational limiter.

11. The blade server assembly of claim 10, wherein the cover latch is one piece.

12. The blade server assembly of claim 10, wherein the rotational limiter hole limits the rotation of the locking surface and the user interface based on a size of area between the rotational limiter hole and the peg.

13. The blade server assembly of claim 10, further comprising a lever that is spring biased away from a rail of the blade server to keep the cover latch in a locked state.

14. The blade server assembly of claim 10, wherein the user interface includes a button for a user to push.

15. The blade server assembly of claim 10, further comprising a pivot hole that attaches the cover latch to the blade server and acts as a pivot upon which the locking surface and the user interface rotate.

16. The blade server assembly of claim 10, wherein the blade server assembly fits in a blade server chassis.

17. The blade server assembly of claim 10, wherein the cover latch is integrated into a rail of a blade server.

18. The blade server assembly of claim 17, wherein in a locked state, the user interface and the locking surface are substantially parallel with the rail of the blade server.

19. The blade server assembly of claim 17, wherein in a unlocked state, the locking surface extends outward from the rail of the blade server and the user interface extends in an opposite rotational direction from the locking surface, wherein the opposite rotational direction is inward into the blade server.

20. The blade server assembly of claim 10, wherein the blade server cover shields components of the blade server.

* * * * *